(12) United States Patent
Wang et al.

(10) Patent No.: US 12,022,698 B2
(45) Date of Patent: Jun. 25, 2024

(54) ARRAY SUBSTRATE, DISPLAY PANEL, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Benlian Wang, Beijing (CN); Yue Long, Beijing (CN); Lili Du, Beijing (CN); Yao Huang, Beijing (CN); Weiyun Huang, Beijing (CN); Tianyi Cheng, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 517 days.

(21) Appl. No.: 17/298,222

(22) PCT Filed: Sep. 22, 2020

(86) PCT No.: PCT/CN2020/116856
§ 371 (c)(1),
(2) Date: May 28, 2021

(87) PCT Pub. No.: WO2022/061523
PCT Pub. Date: Mar. 31, 2022

(65) Prior Publication Data
US 2022/0320220 A1    Oct. 6, 2022

(51) Int. Cl.
*H10K 59/126*    (2023.01)

(52) U.S. Cl.
CPC ................... *H10K 59/126* (2023.02)

(58) Field of Classification Search
CPC .............. H10K 59/126; H01L 27/1225; H01L 29/78633
See application file for complete search history.

(56) References Cited

U.S. PATENT DOCUMENTS

2010/0176383 A1*  7/2010  Park ................... H01L 27/1225
                                                          438/46
2016/0064421 A1*  3/2016  Oh ...................... H01L 27/1255
                                                          257/43
(Continued)

FOREIGN PATENT DOCUMENTS

CN    106783921 A    5/2017
CN    108231671 A    6/2018
(Continued)

*Primary Examiner* — Sitaramarao S Yechuri
(74) *Attorney, Agent, or Firm* — Workman Nydegger

(57) ABSTRACT

The present disclosure provides an array substrate, a display panel and a display device. The array substrate includes: a base substrate; a low temperature poly-silicon thin film transistor located on the base substrate and including a poly-silicon active layer and a first gate which are laminated on the base substrate; an oxide thin film transistor located on the base substrate and including an oxide active layer and a second gate which are laminated on the base substrate; and a light shielding layer, where an overlapping area of a projection of the light shielding layer on the base substrate and an orthographic projection of the oxide active layer on the base substrate is S1, an overlapping area of the projection of the light shielding layer on the base substrate and an orthographic projection of the poly-silicon active layer on the base substrate is S2, and S1 is greater than S2.

14 Claims, 8 Drawing Sheets

(56) References Cited

U.S. PATENT DOCUMENTS

| | | | |
|---|---|---|---|
| 2017/0033127 A1* | 2/2017 | Zhao | ................ H01L 29/78606 |
| 2017/0162606 A1* | 6/2017 | Yan | .................... H01L 27/1248 |
| 2018/0226462 A1 | 8/2018 | Zhou et al. | |
| 2019/0103443 A1 | 4/2019 | Kim et al. | |
| 2019/0214447 A1* | 7/2019 | Kim | .................. H10K 59/1216 |
| 2021/0257392 A1 | 8/2021 | Huang et al. | |

FOREIGN PATENT DOCUMENTS

| | | |
|---|---|---|
| CN | 108321159 A | 7/2018 |
| CN | 109300840 A | 2/2019 |
| CN | 110690232 A | 1/2020 |
| CN | 111276497 A | 6/2020 |

\* cited by examiner

ARRAY SUBSTRATE, DISPLAY PANEL, AND DISPLAY DEVICE

This disclosure is a U.S. National Stage of International Application No. PCT/CN2020/116856, filed Sep. 22, 2020, and entitled "ARRAY SUBSTRATE, DISPLAY PANEL, AND DISPLAY DEVICE", the content of which is hereby incorporated by reference in its entirety.

FIELD

The present disclosure relates to the technical field of display, in particular to an array substrate, a display panel, and a display device.

BACKGROUND

With the continuous development of display technology, people have higher and higher requirements for the resolution, power consumption and image quality of display products. In order to meet these requirements, low temperature polycrystalline oxide (LTPO) technology is often used to make pixel drive circuits in drive backplanes of display products at present. This LTPO technology is to simultaneously use low temperature poly-silicon thin film transistors (LTPS TFT) and metal oxide thin film transistors (Oxide TFT) as functional tubes in the pixel drive circuits. Due to the high mobility of the low temperature poly-silicon thin film transistors, the charging speed of pixel capacitors can be increased, the metal oxide thin film transistors have lower leakage current, and combining the advantages of these two transistors will help the development of high-resolution, low-power-consumption, and high-quality display products.

SUMMARY

The embodiment of the present disclosure provides an array substrate, including
a base substrate;
a low temperature poly-silicon thin film transistor located on the base substrate, where the low temperature poly-silicon thin film transistor includes a poly-silicon active layer and a first gate which are laminated on the base substrate;
an oxide thin film transistor located on the base substrate, where the oxide thin film transistor includes an oxide active layer and a second gate which are laminated on the base substrate; and
a light shielding layer, where an overlapping area of a projection of the light shielding layer on the base substrate and an orthographic projection of the oxide active layer on the base substrate is S1, an overlapping area of the projection of the light shielding layer on the base substrate and an orthographic projection of the poly-silicon active layer on the base substrate is S2, and S1 is greater than S2.

In one possible implementation, the light shielding layer and the first gate are located on the same layer and made of the same material.

In one possible implementation, the light shielding layer is located between a layer where the first gate is located and a layer where the oxide active layer is located.

In one possible implementation, the light shielding layer is located between a layer where the poly-silicon active layer is located and a layer where the base substrate is located.

In one possible implementation, the first gate and the second gate are made of the same material, and the light shielding layer and the second gate are made of the same material.

In one possible implementation, the oxide active layer is located on a side, facing away from the base substrate, of the first gate, and a first buffer layer is located between the oxide active layer and the first gate.

In one possible implementation, a second buffer layer is located between the base substrate and the poly-silicon active layer; a barrier layer is located between the second buffer layer and the base substrate; a first gate insulating layer is located between the poly-silicon active layer and the first gate; a second gate insulating layer is located between the oxide active layer and the second gate; and an interlayer dielectric layer is located on a side, facing away from the base substrate, of the second gate.

In one possible implementation, the light shielding layer is located between the layer where the first gate is located and the layer where the oxide active layer is located, and a third gate insulating layer is further located between the first buffer layer and the first gate; and the light shielding layer is located between the first buffer layer and the third gate insulating layer.

In one possible implementation, the light shielding layer is located between the layer where the poly-silicon active layer is located and the layer where the base substrate is located, and the light shielding layer is located between the second buffer layer and the barrier layer.

In one possible implementation, a source-drain layer is located on a side, facing away from the base substrate, of the interlayer dielectric layer, and the source-drain layer includes a first source, a first drain, a second source, and a second drain; the first source is connected to a source region of the poly-silicon active layer through a first via hole, and the first drain is connected to a drain region of the poly-silicon active layer through a second via hole; and the second source is connected to the oxide active layer through a third via hole, and the second drain is connected to the oxide active layer through a fourth via hole.

In one possible implementation, a first flat layer is located on a side, facing away from the base substrate, of the source-drain layer; a connection electrode is located on a side, facing away from the base substrate, of the first flat layer; a second flat layer is located on a side, facing away from the base substrate, of the connection electrode; an anode is located on a side, facing away from the base substrate, of the second flat layer; and the anode and the connection electrode are conducted through a fifth via hole penetrating the second flat layer, and the connection electrode and the first drain are conducted through a sixth via hole penetrating the first flat layer.

In one possible implementation, a pixel defining layer is located on a side, facing away from the base substrate, of the anode, a spacer is located on a side, facing away from the base substrate, of the pixel defining layer, and the pixel defining layer has a hollow region where the anode is exposed.

The embodiment of the present disclosure further provides a display panel including the array substrate as provided in the embodiments of the present disclosure.

The embodiment of the present disclosure further provides a display device including the display panel as provided in the embodiments of the present disclosure.

DETAILED DESCRIPTION OF THE EMBODIMENTS

Figure 1:
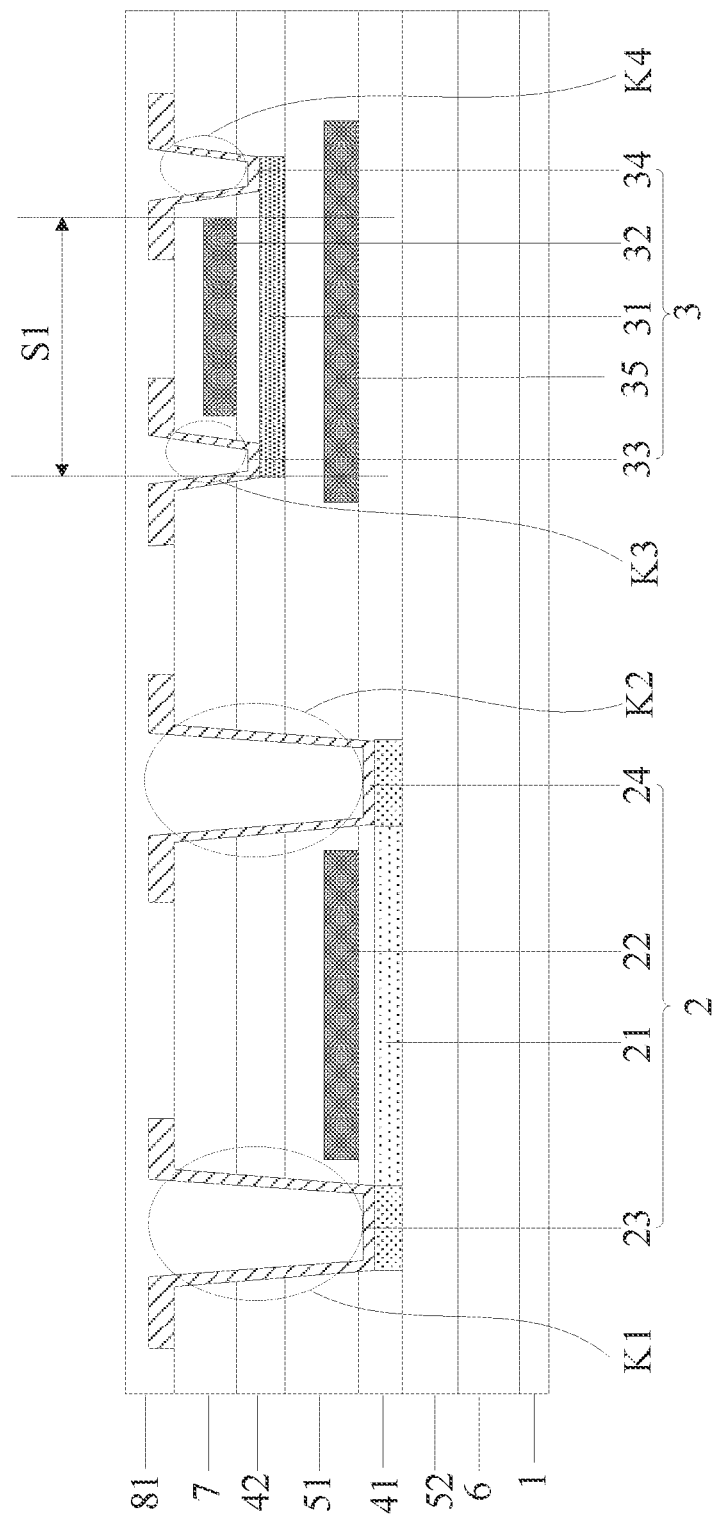
FIG. 1 is a schematic structural diagram of an array substrate having a light shielding layer under an oxide thin film transistor provided by an embodiment of the disclosure.

In order to make the objectives, technical solutions, and advantages of the embodiments of the present disclosure clearer, the technical solutions of the embodiments of the present disclosure will be described clearly and completely in conjunction with the accompanying drawings of the embodiments of the present disclosure. It should be noted that the dimensions and shapes of the various figures in the drawings are not to scale and are intended to be merely illustrative of the present disclosure. And the same or similar reference numerals refer to the same or similar elements or elements having the same or similar functions throughout. It is to be understood that the described embodiments are some, but not all, embodiments of the present disclosure. Based on the described embodiments of the present disclosure, all other embodiments attainable by one of ordinary skill in the art without involving any inventive effort are within the scope of the present disclosure.

Unless defined otherwise, technical or scientific terms used herein shall have the ordinary meaning as understood by one of ordinary skill in the art to which this disclosure belongs. The terms "first", "second", and similar referents used in the present disclosure and claims do not denote any order, quantity, or importance, but rather are used solely to distinguish one from another. The word "comprising" or "containing", and the like, means that an element or article that precedes the word is inclusive of the element or article listed after the word and equivalents thereof, but does not exclude other elements or articles. The terms "inner", "outer", "upper", "lower", and the like are used merely to denote a relative positional relationship that may change accordingly when the absolute position of the object being described changes.

Referring to FIG. 1, an embodiment of the present disclosure provides an array substrate which includes:

a base substrate 1;

a low temperature poly-silicon thin film transistor 2 located on the base substrate 1, where the low temperature poly-silicon thin film transistor 2 includes a poly-silicon active layer 21 and a first gate 22 which are sequentially laminated on the base substrate 1, and the first gate 22 is located on a side, facing away from the base substrate 1, of the poly-silicon active layer 21;

an oxide thin film transistor 3 located on the base substrate 1, where an orthographic projection of the oxide thin film transistor 3 on the base substrate 1 and an orthographic projection of the low temperature poly-silicon thin film transistor 2 on the base substrate 1 do not overlap, the oxide thin film transistor 3 includes an oxide active layer 31 and a second gate 32 which are sequentially laminated on the base substrate 1, and the second gate 32 is located on a side, facing away from the base substrate 1, of the oxide active layer 31; and a light shielding layer 35, where an overlapping area of a projection of the light shielding layer 35 on the base substrate 1 and an orthographic projection of the oxide active layer 31 on the base substrate 1 is S1, an overlapping area of the projection of the light shielding layer 35 on the base substrate 1 and an orthographic projection of the poly-silicon active layer 21 on the base substrate 1 is S2, and S1 is greater than S2.

In the array substrate provided by the embodiment of the present disclosure, a film layer between the poly-silicon active layer 21 and the base substrate 1 is a transparent film layer in a region where the low temperature poly-silicon thin film transistor 2 is located, the oxide thin film transistor 3 includes the oxide active layer 31 and the second gate 32 which are sequentially laminated on the base substrate 1, the overlapping area of the projection of the light shielding layer 35 on the base substrate 1 and the orthographic projection of the oxide active layer 31 on the base substrate 1 is S1, the overlapping area of the projection of the light shielding layer 35 on the base substrate 1 and the orthographic projection of the poly-silicon active layer 21 on the base substrate 1 is S2, and S1 is greater than S2. The high mobility characteristic of the low temperature poly-silicon thin film transistor 2 may be applied to transistors requiring high switching speed, the low leakage characteristic of the oxide thin film transistor 3 may be applied to transistors requiring high leakage control, and therefore the array substrate simultaneously has high switching speed and low leakage performance.

In a specific implementation, the overlapping area S2 between the projection of the light shielding layer 35 on the base substrate 1 and the orthographic projection of the poly-silicon active layer 21 on the base substrate 1 may be zero. That is, no light shielding layer is disposed between the poly-silicon active layer 21 and the base substrate 1. The film layer between the poly-silicon active layer 21 and the base substrate 1 is the transparent film layer in the region where the low temperature poly-silicon thin film transistor 2 is located. For example, as shown in FIG. 1, a barrier layer 6 is disposed between the poly-silicon active layer 21 and the base substrate 1, and a second buffer layer 52 is located between the barrier layer 6 and the poly-silicon active layer 21, so that the barrier layer 6 and the second buffer layer 52 in the region where the low temperature poly-silicon thin film transistor 2 is located are both transparent film layers, that is, in the region where the low temperature poly-silicon thin film transistor 2 is located.

In a specific implementation, only the second gate 32 of the oxide thin film transistor 3 loads a gate signal, that is, the oxide thin film transistor 3 is a single-gate and further top-gate type thin film transistor. Even if the light shielding layer is disposed in a region where the oxide thin film transistor 3 is located, the light shielding layer is only a film layer used for shielding light, but not loading a driving gate signal.

It should be noted that poly-silicon materials have high mobility, low energy consumption, and high reliability. Therefore, the low temperature poly-silicon thin film transistor 2 may be applied to a gate driver and/or a multiplexer (MUX) of a driving element for driving a thin film transistor of a display device. Preferably, the low temperature poly-silicon thin film transistor 2 may be applied to a driving transistor in a pixel circuit of an organic light emitting display device. A band gap of an oxide semiconductor material is larger than that of a silicon material, so that electrons cannot pass through the band gap in an off state, and an off current is low. Therefore, the oxide thin film transistor 3 is suitable for a thin film transistor that is kept on for a short time and off for a long time. In addition, since the off current is low, a size of an auxiliary capacitor may be reduced. Therefore, the oxide thin film transistor 3 is suitable for high-resolution display elements. Illustratively, the oxide thin film transistor 3 may be applied to a switching transistor in the pixel circuit of the organic light emitting display device. In addition, the base substrate 1 may be a base made of flexible materials such as polyimide (PI), or a base made of rigid materials such as glass, which is not limited herein. The low temperature poly-silicon thin film transistor 2 may specifically be a top-gate type low temperature poly-silicon thin film transistor 2. The oxide thin film transistor 3 may specifically be a top-gate type oxide thin film transistor 3.

Figure 4:
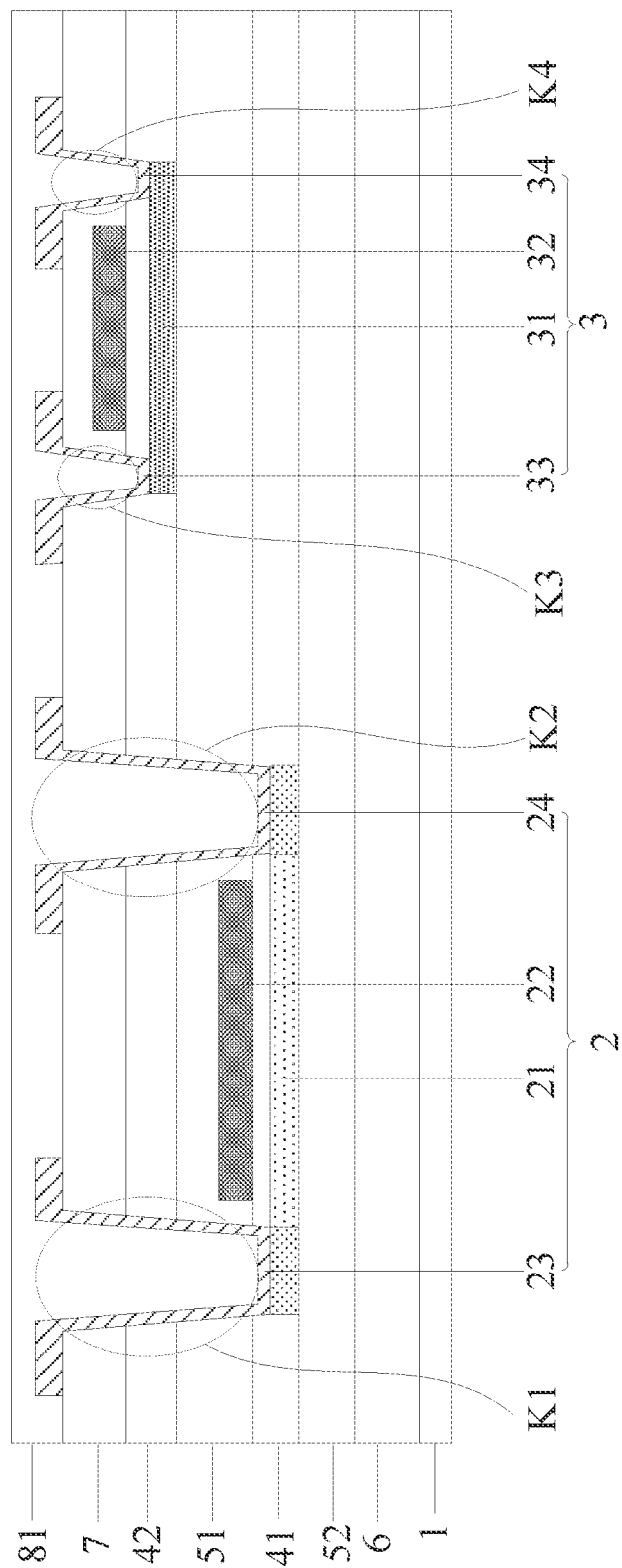
FIG. 4 is a schematic structural diagram of an array substrate having no light shielding layer under an oxide thin film transistor provided by an embodiment of the disclosure.
Figure 5:
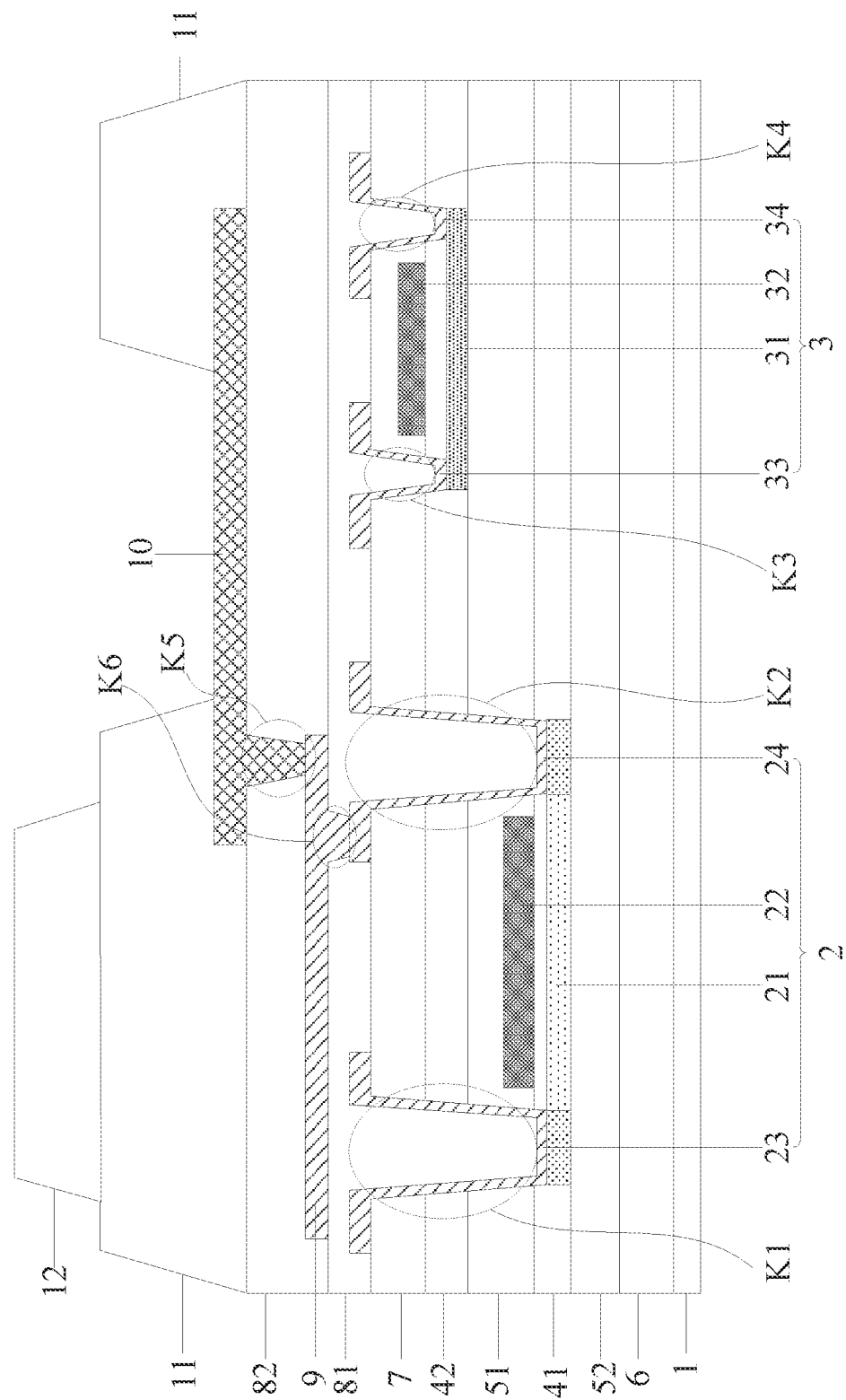
FIG. 5 is a schematic structural diagram of a specific array substrate having no light shielding layer under an oxide thin film transistor provided by an embodiment of the disclosure.

In a specific implementation, as shown in FIG. 4, a film layer between the oxide active layer 31 and the base substrate 1 is a transparent film layer in the region where the oxide thin film transistor 3 is located. For example, as shown in FIG. 4, the barrier layer 6 is disposed between the oxide active layer 31 and the base substrate 1, and the second buffer layer 52 is located between the barrier layer 6 and the poly-silicon active layer 21, so that the barrier layer 6 and the second buffer layer 52 in the region where the oxide thin film transistor 3 is located are both transparent film layers, that is, in the region where the oxide thin film transistor 3 is located, no light shielding layer is disposed between the poly-silicon active layer 21 and the base substrate 1.

Figure 2:
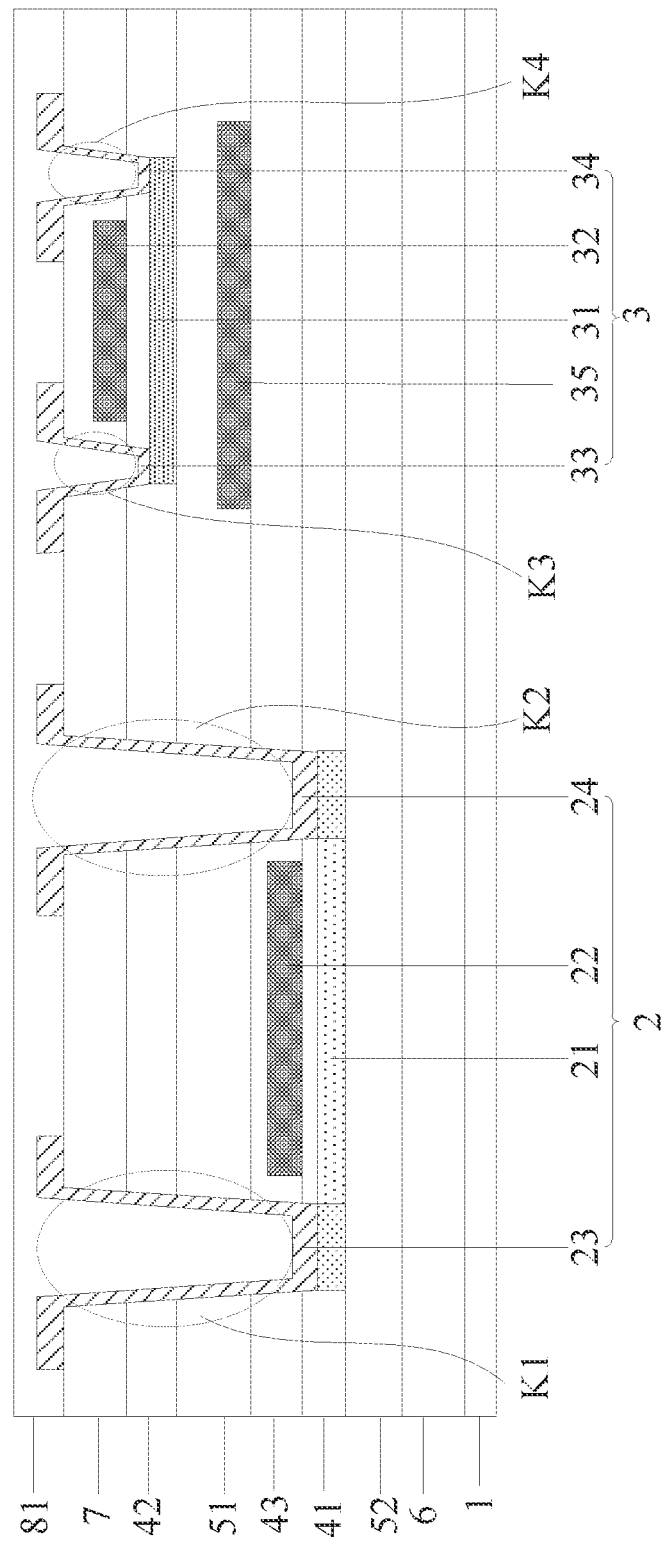
FIG. 2 is a schematic structural diagram of another array substrate having a light shielding layer under an oxide thin film transistor provided by an embodiment of the disclosure.
Figure 3:
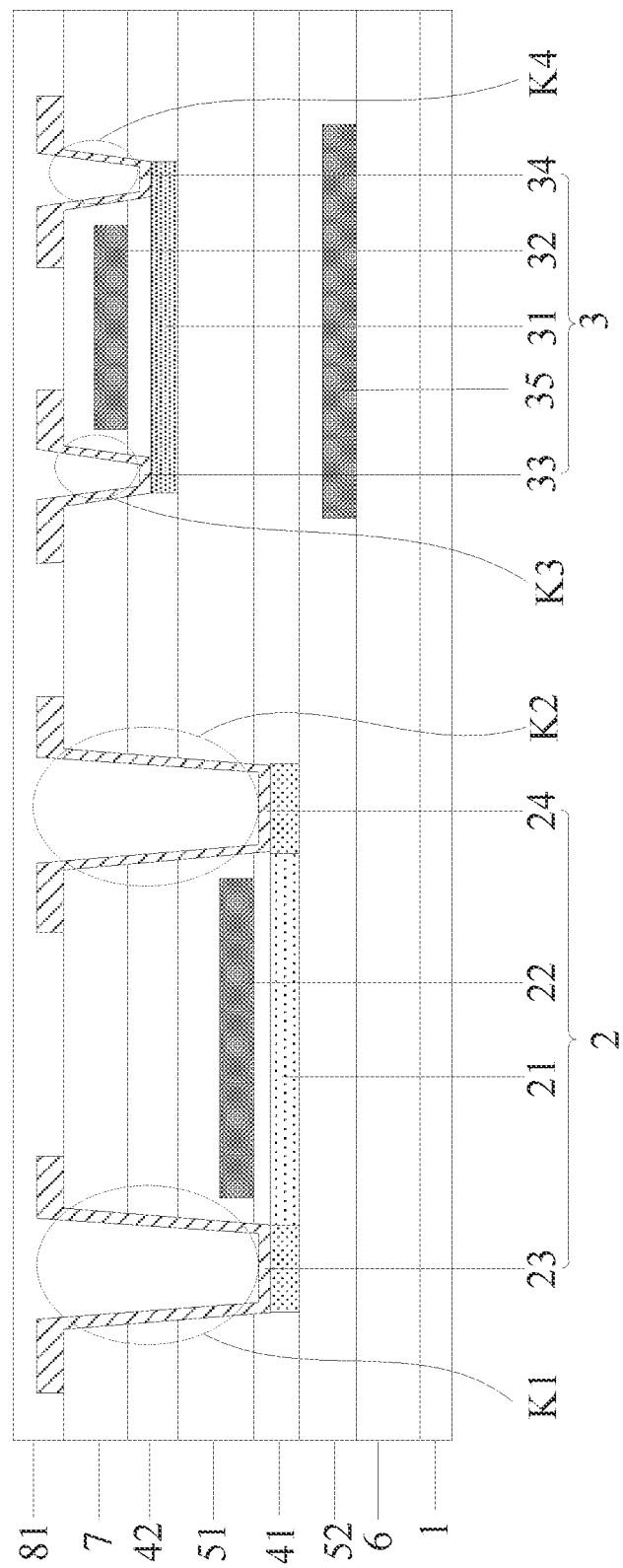
FIG. 3 is a schematic structural diagram of another array substrate having a light shielding layer under an oxide thin film transistor provided by an embodiment of the disclosure.

In a specific implementation, referring to FIGS. 1, 2, and 3, the projection of the light shielding layer 35 on the base substrate 1 covers the orthographic projection of the oxide active layer 31 on the base substrate 1.

Specifically, as shown in FIG. 1, the light shielding layer 35 and the first gate 22 may be located on the same layer, and the light shielding layer 35 may be made of metals or alloys such as molybdenum, aluminum, copper, and titanium/aluminum/titanium; alternatively, the light shielding layer 35 may further be made of a black organic material, for example, black organic resin; alternatively, the light shielding layer 35 may further be made of carbon black; alternatively, the light shielding layer 35 may further be made of black pigment. The light shielding layer 35 may be made of the same material as or different material from the first gate 22. The first gate 22 may be made of metals or alloys such as molybdenum, aluminum, copper, and titanium/aluminum/titanium. The second gate 32 may be made of metals or alloys such as molybdenum, aluminum, copper, and titanium/aluminum/titanium. A first source 23 and a first drain 24 may be made of metals or alloys such as molybdenum, aluminum, copper, and titanium/aluminum/titanium. A second source 33 and a second drain 34 may be made of metals or alloys such as molybdenum, aluminum, copper, and titanium/aluminum/titanium.

The thickness of the light shielding layer 35 may specifically be 1000 Å to 5000 Å. Specifically, the thickness of the light shielding layer 35 may be 2000 Å to 4000 Å. Specifically, the thickness of the light shielding layer 35 may be 2000 Å to 3000 Å. Specifically, the thickness of the light shielding layer 35 may be 2200 Å to 2600 Å. Specifically, the thickness of the light shielding layer 35 may be 2200 Å. Specifically, the thickness of the light shielding layer 35 may be 2300 Å. Specifically, the thickness of the light shielding layer 35 may be 2400 Å. Specifically, the thickness of the light shielding layer 35 may be 2500 Å. Specifically, the thickness of the light shielding layer 35 may be 2600 Å.

Specifically, the light shielding layer 35 and the first gate 22 are located on the same layer and made of the same material. Specifically, the light shielding layer 35 may be made of the metals or alloys such as molybdenum, aluminum, copper, and titanium/aluminum/titanium.

Specifically, as shown in FIG. 2, the light shielding layer 35 is located between a layer where the first gate 22 is located and a layer where the oxide active layer 31 is located. For example, as shown in FIG. 3, the light shielding layer 35 is located between a layer where the poly-silicon active layer 21 is located and a layer where the base substrate 1 is located.

In a specific implementation, the first gate 22 and the second gate 32 are made of the same material, and the light shielding layer 35 and the second gate 32 are made of the same material.

In a specific implementation, as shown in FIGS. 1, 2, 3, and 4, the oxide active layer 31 is located on a side, facing away from the base substrate 1, of the first gate 22, and a first buffer layer 51 is located between the oxide active layer 31 and the second gate 22. Specifically, the second buffer layer 52 is located between the base substrate 1 and the poly-silicon active layer 21; the barrier layer 6 is located between the second buffer layer 52 and the base substrate 1; a first gate insulating layer 41 is located between the poly-silicon active layer 21 and the first gate 22; a second gate insulating layer 42 is located between the oxide active layer 31 and the second gate 32; and an interlayer dielectric layer 7 is located between a side, facing away from the base substrate 1, of the second gate 32.

In a specific implementation, as shown in FIG. 2, when the light shielding layer 35 is located between the layer where the first gate 22 is located and the layer where the oxide active layer 31 is located, a third gate insulating layer 43 is further located between the first buffer layer 51 and the first gate 22, and the light shielding layer 35 is located between the first buffer layer 51 and the third gate insulating layer 43.

In a specific implementation, as shown in FIG. 3, when the light shielding layer 35 is located between the layer where the poly-silicon active layer 21 is located and the layer where the base substrate 1 is located, and the light shielding layer 35 is located between the second buffer layer 52 and the barrier layer 6.

In a specific implementation, as shown in FIGS. 1, 2, 3, and 4, a source/drain layer is located on a side, facing away from the base substrate 1, of the interlayer dielectric layer 7, and the source/drain layer includes the first source 23, the first drain 24, the second source 33, and the second drain 34. The first source 23 is connected to a source region of the poly-silicon active layer 21 through a first via hole K1, and the first drain 24 is connected to a drain region of the poly-silicon active layer 21 through a second via hole K2. The second source 33 is connected to the oxide active layer 31 through a third via hole K3, and the second drain 34 is connected to the oxide active layer 31 through a fourth via hole K4.

Figure 6:
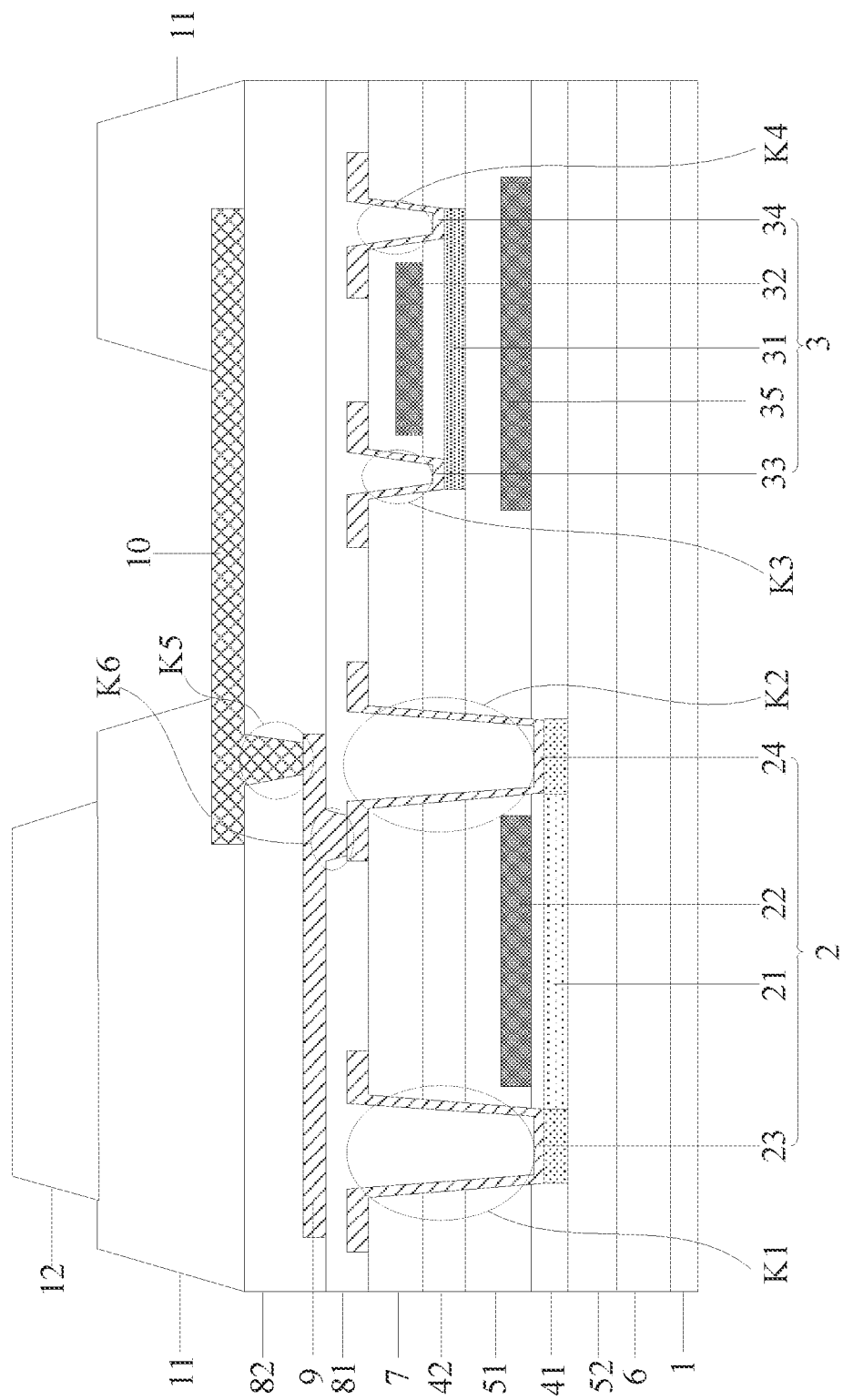
FIG. 6 is a schematic structural diagram of a specific array substrate having a light shielding layer under an oxide thin film transistor provided by an embodiment of the disclosure.
Figure 7:
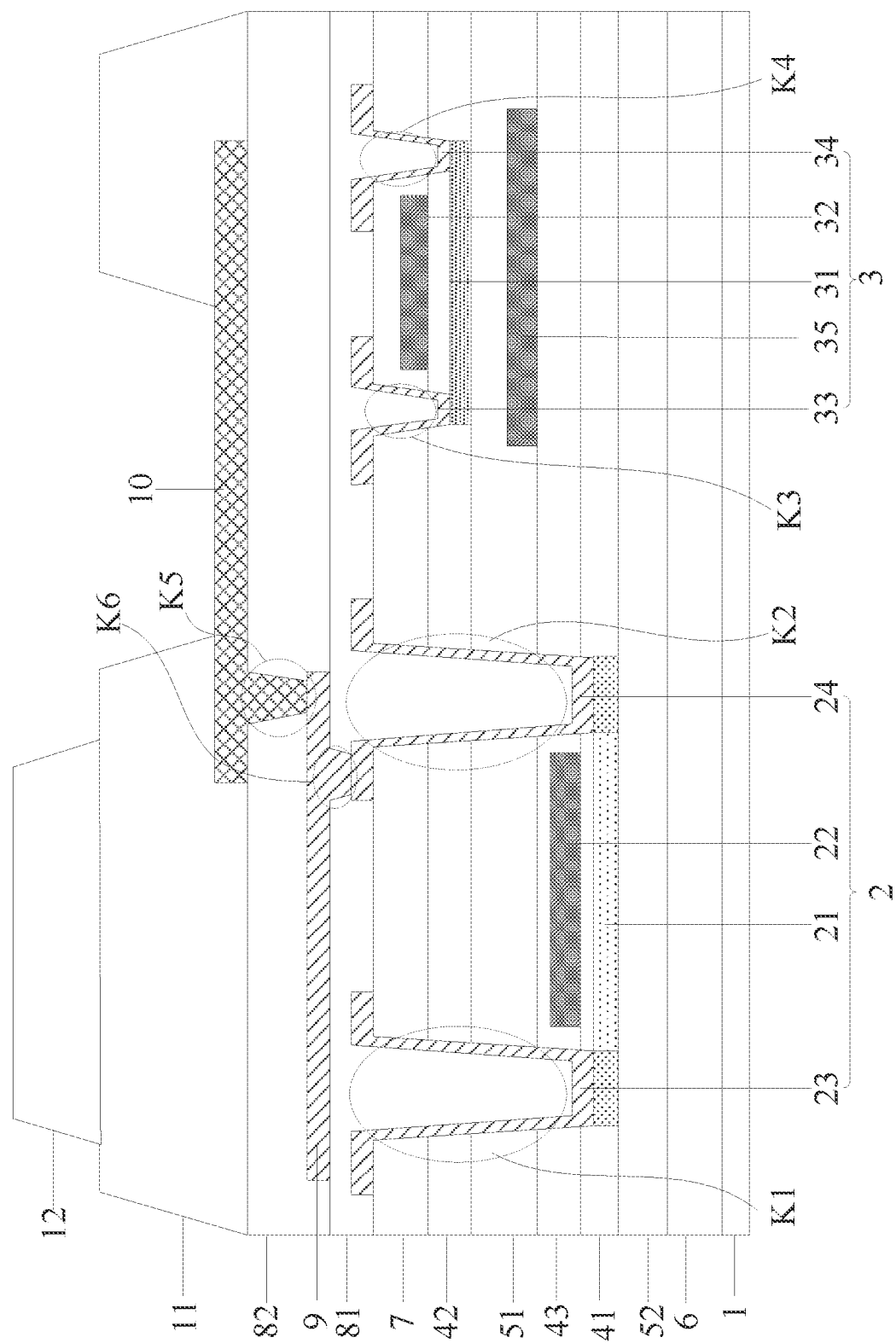
FIG. 7 is a schematic structural diagram of another specific array substrate having a light shielding layer under an oxide thin film transistor provided by an embodiment of the disclosure.
Figure 8:
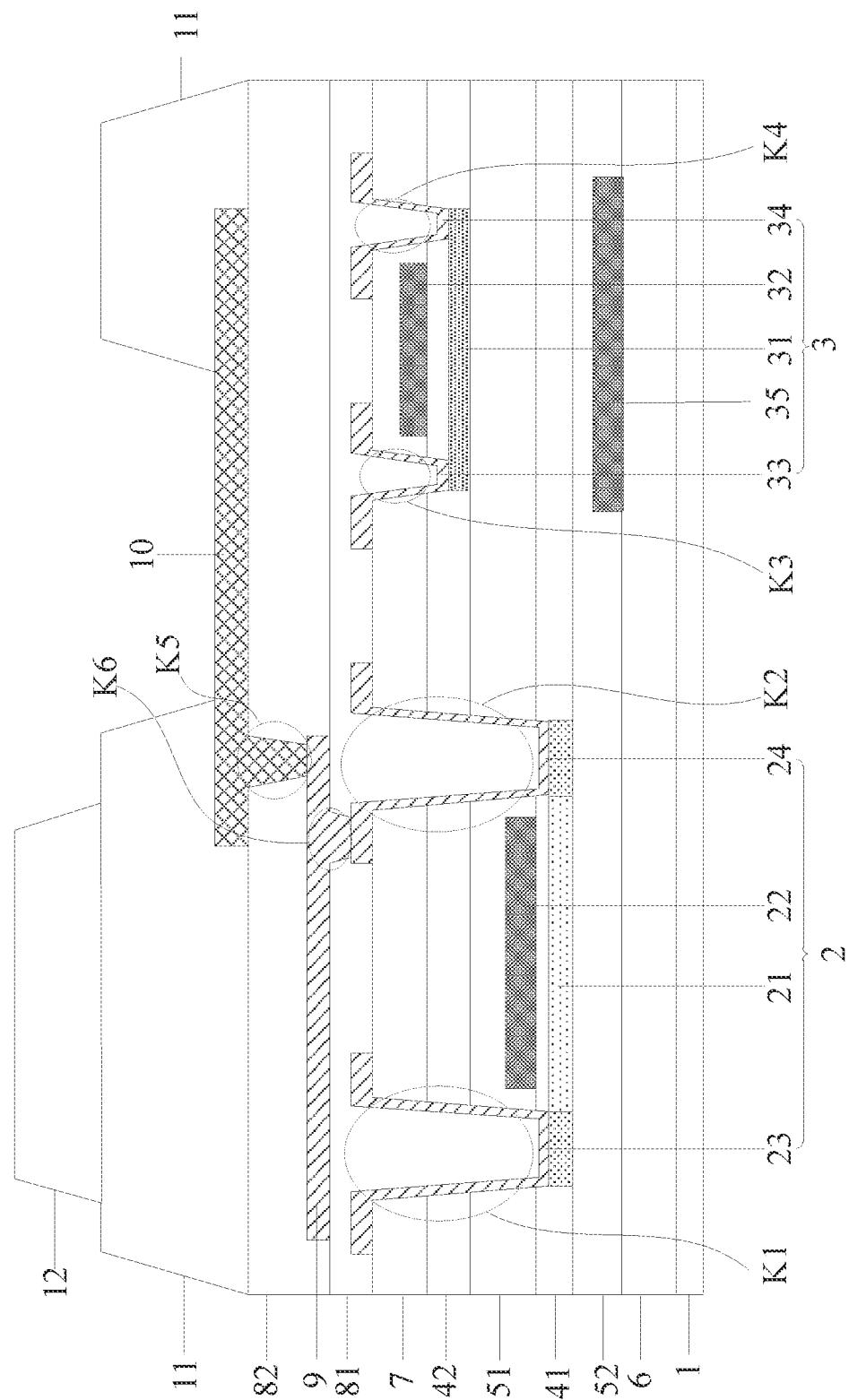
FIG. 8 is a schematic structural diagram of another specific array substrate having a light shielding layer under an oxide thin film transistor provided by an embodiment of the disclosure.

In a specific implementation, as shown in FIGS. 5, 6, 7, and 8, FIG. 5 is a schematic structural diagram of a specific array substrate corresponding to FIG. 1, FIG. 6 is a schematic structural diagram of a specific array substrate corresponding to FIG. 2, FIG. 7 is a schematic structural diagram of a specific array substrate corresponding to FIG. 3, and FIG. 8 is a schematic structural diagram of a specific array substrate corresponding to FIG. 4. A first flat layer 81 is located on a side, facing away from the base substrate 1, of the source/drain layer. A connection electrode 9 is located on a side, facing away from the base substrate 1, of the first flat layer 81. A second flat layer 82 is located on a side, facing away from the base substrate 1, of the connection electrode 9. An anode 10 is located on a side, facing away from the base substrate 1, of the second flat layer 82. The anode 10 and the connection electrode 9 are conducted through a fifth via hole K5 penetrating the second flat layer 82. The connection electrode 9 and the first drain 24 are conducted through a sixth via hole K6 penetrating the first flat layer 81.

In a specific implementation, a capacitance storage electrode for storing capacitance is arranged on a layer where the connection electrode 9 is located and is located on the same layer as the connection electrode 9. The capacitance storage electrode may be made of the same material as the first gate 22, or as the second gate 32, or as the first source 23 and the first drain 24, or as the second source 33 and the second drain 34. The capacitance storage electrode may be connected to a fixed potential, and may load a potential the same as or different from that of the light shielding layer 35.

The potential loaded by the light shielding layer may be the same as a potential loaded by a power supply line VDD, or as a potential loaded by an initialization signal line, or as a potential loaded by a cathode (a cathode potential VSS), or may be other fixed potentials. For example, the fixed potentials are in a range of −10V to +10V; alternatively, the fixed potentials are in a range of −5V to +5V; alternatively, the fixed potentials are in a range of −3V to +3V; alternatively, the fixed potentials are in a range of −1V to +1 V; alternatively, the fixed potentials are in a range of −0.5V to +0.5 V; alternatively, the fixed potentials are in a range of 0 V; alternatively, the fixed potentials are in a range of 0.1 V; alternatively, the fixed potentials are in a range of −0.1 V; alternatively, the fixed potentials are in a range of 0.2 V; alternatively, the fixed potentials are in a range of −0.2 V; alternatively, the fixed potentials are in a range of 0.3 V; alternatively, the fixed potentials are in a range of −0.3 V.

Specifically, the potential loaded by the light shielding layer 35 may be greater than the potential loaded by the cathode (cathode potential VSS) and less than the potential loaded by the power supply line VDD. Alternatively, the potential loaded by the light shielding layer 35 may be greater than the potential loaded by the initialization signal line and less than the potential loaded by the power supply line VDD.

In a specific implementation, as shown in FIGS. 5, 6, 7 and 8, a pixel defining layer 11 is located on a side, facing away from the base substrate 1, of the anode 10, a spacer 12 is located on a side, facing away from the base substrate 1, of the pixel defining layer 11, and the pixel defining layer 11 has a hollow region where the anode 10 is exposed.

Specifically, the first gate 22, the second gate 32, and the light shielding layer 35 may be made of metals or alloys such as molybdenum, aluminum, copper, titanium/aluminum/titanium, which are not limited herein. The oxide active layer 31 may specifically be made of indium gallium zinc oxide (IGZO). The barrier layer 6 may specifically be made of SiOx/SiNx/SiOx/SiNx laminated sequentially. The first buffer layer 51 may be made of SiOx/SiNx/SiOx laminated sequentially. The second buffer layer 52 may be made of SiOx. The first insulating layer 41 may be made of SiOx. The second insulating layer 42 may be made of SiOx. The third insulating layer 43 may be made of SiOx. The interlayer dielectric layer 7 may be made of SiOx. The first flat layer 81 may be made of SiNx. The second flat layer 82 may be made of SiNx.

In a specific embodiment, the first insulating layer 41, the second insulating layer 42, the third insulating layer 43, and the interlayer dielectric layer 7 may be made of the same material, for example, SiOx. For example, an oxygen content of each film layer may be the same or different. When the oxygen content of each film layer is the same or approximately the same, there is no obvious film layer boundary between each film layer.

It should be noted that "approximately" in the present disclosure means that the error does not exceed 10%.

An embodiment of the present disclosure further provides a display panel which includes the array substrate as provided in the embodiment of the present disclosure. The display panel may be an organic light emitting diode (OLED) display panel or a quantum light emitting diode (QLED) display panel. Other essential components of the display panel will be apparent to those of ordinary skill in the art and are not described in detail herein, nor should they be construed as limiting the present disclosure. Since the principle of solving problems by the display panel is similar to the principle of solving problems by the above-mentioned display substrate, the implementation of the display panel provided by the embodiment of the present disclosure can be referred to the implementation of the above-mentioned display substrate provided by the embodiment of the present disclosure, which will not be repeated here.

An embodiment of the present disclosure further provides a display device which includes the display panel as provided in the embodiment of the present disclosure. The display device may be any product or component with a display function, such as a mobile phone, a tablet computer, a television, a display, a notebook computer, a digital photo frame, a navigator, an intelligent watch, a body-building wrist strap, and a personal digital assistant. Other essential components of the display device will be apparent to those of ordinary skill in the art and are not described in detail herein, nor should they be construed as limiting the present disclosure. In addition, since the principle of solving problems by the display device is similar to the principle of solving problems by the above-mentioned display panel, the implementation of the display device can be referred to the embodiment of the above-mentioned display panel, which will not be repeated here.

In the array substrate provided by the embodiment of the present disclosure, the film layer between the poly-silicon active layer 21 and the base substrate 1 is the transparent film layer in the region where the low temperature poly-silicon thin film transistor 2 is located, the oxide thin film transistor 3 includes the oxide active layer 31 and the second gate 32 which are sequentially laminated on the base substrate 1, and only the second gate 32 of the oxide thin film transistor 3 loads the gate signal, the high mobility characteristic of the low temperature poly-silicon thin film transistor 2 can be applied to transistors requiring high switching speed, and the low leakage characteristic of the oxide thin film transistor 3 can be applied to transistors requiring high leakage control, so that the array substrate simultaneously has high switching speed and low leakage performance.

Although preferred embodiments of the present disclosure have been described, additional alterations and modifications of these embodiments will occur to those skilled in the art upon attaining the basic inventive concept. It is therefore intended that the appended claims be interpreted as including the preferred embodiments and all such alterations and modifications as fall within the true scope of the present invention.

It will be apparent to those skilled in the art that various modifications and variations can be made in the embodiments of the present disclosure without departing from the spirit or scope of the embodiments of the disclosure. Thus, it is intended that the present disclosure covers the modifications and variations of this embodiment provided they come within the scope of the appended claims and their equivalents.

What is claimed is:

1. An array substrate, comprising:
   a base substrate;
   a low temperature poly-silicon thin film transistor located on the base substrate, wherein the low temperature poly-silicon thin film transistor comprises a poly-silicon active layer and a first gate which are laminated on the base substrate;
   an oxide thin film transistor located on the base substrate, wherein the oxide thin film transistor comprises an oxide active layer and a second gate which are laminated on the base substrate; and
   a light shielding layer, wherein an overlapping area of a projection of the light shielding layer on the base substrate and an orthographic projection of the oxide active layer on the base substrate is S1, an overlapping area of the projection of the light shielding layer on the base substrate and an orthographic projection of the poly-silicon active layer on the base substrate is S2, and S1 is greater than S2;
   wherein the oxide active layer is located on a side, facing away from the base substrate, of the first gate, and a first buffer layer is located between the oxide active layer and the first gate;
   wherein a second buffer layer is located between the base substrate and the poly-silicon active layer; a barrier layer is further located between the second buffer layer and the base substrate, a first gate insulating layer is located between the poly-silicon active layer and the first gate; a second gate insulating layer is located between the oxide active layer and the second gate; and an interlayer dielectric layer is located on a side, facing away from the base substrate, of the second gate;
   wherein the light shielding layer is located between a layer where the first gate is located and a layer where the oxide layer is located, and a third gate insulating layer is further located between the first buffer layer and the first gate; and the light shielding layer is located between the first buffer layer and the third gate insulating layer.

2. The array substrate according to claim 1, wherein the light shielding layer and the first gate are located on the same layer.

3. The array substrate according to claim 1, wherein the light shielding layer is located between a layer where the first gate is located and a layer where the oxide active layer is located.

4. The array substrate according to claim 1, wherein the light shielding layer is located between a layer where the poly-silicon active layer is located and a layer where the base substrate is located.

5. The array substrate according to claim 1, wherein the first gate and the second gate are made of the same material, and the light shielding layer and the second gate are made of the same material.

6. The array substrate according to claim 1, wherein a source-drain layer is located on a side, facing away from the base substrate, of the interlayer dielectric layer, and the source-drain layer comprises a first source, a first drain, a second source, and a second drain;
   the first source is connected to a source region of the poly-silicon active layer through a first via hole, and the first drain is connected to a drain region of the poly-silicon active layer through a second via hole; and
   the second source is connected to the oxide active layer through a third via hole, and the second drain is connected to the oxide active layer through a fourth via hole.

7. The array substrate according to claim 6, wherein
   a first flat layer is located on a side, facing away from the base substrate, of the source-drain layer;
   a connection electrode is located on a side, facing away from the base substrate, of the first flat layer;
   a second flat layer is located on a side, facing away from the base substrate, of the connection electrode;
   an anode is located on a side, facing away from the base substrate, of the second flat layer; and
   the anode and the connection electrode are conducted through a fifth via hole penetrating the second flat layer, and the connection electrode and the first drain are conducted through a sixth via hole penetrating the first flat layer.

8. The array substrate according to claim 7, wherein a pixel defining layer is located on a side, facing away from the base substrate, of the anode, a spacer is located on a side, facing away from the base substrate, of the pixel defining layer, and the pixel defining layer has a hollow region where the anode is exposed.

9. A display panel, comprising an array substrate, wherein the array substrate comprises:
   a base substrate;
   a low temperature poly-silicon thin film transistor located on the base substrate, wherein the low temperature poly-silicon thin film transistor comprises a poly-silicon active layer and a first gate which are laminated on the base substrate;
   an oxide thin film transistor located on the base substrate, wherein the oxide thin film transistor comprises an oxide active layer and a second gate which are laminated on the base substrate; and
   a light shielding layer, wherein an overlapping area of a projection of the light shielding layer on the base substrate and an orthographic projection of the oxide active layer on the base substrate is S1, an overlapping area of the projection of the light shielding layer on the base substrate and an orthographic projection of the poly-silicon active layer on the base substrate is S2, and S1 is greater than S2;
   wherein the oxide active layer is located on a side, facing away from the base substrate, of the first gate, and a first buffer layer is located between the oxide active layer and the first gate;
   wherein a second buffer layer is located between the base substrate and the poly-silicon active layer; a barrier layer is further located between the second buffer layer and the base substrate, a first gate insulating layer is located between the poly-silicon active layer and the first gate; a second gate insulating layer is located between the oxide active layer and the second gate; and an interlayer dielectric layer is located on a side, facing away from the base substrate, of the second gate;

wherein the light shielding layer is located between a layer where the first gate is located and a layer where the oxide layer is located, and a third gate insulating layer is further located between the first buffer layer and the first gate; and the light shielding layer is located between the first buffer layer and the third gate insulating layer.

10. A display device, comprising the display panel of claim 9.

11. An array substrate, comprising:

a base substrate;

a low temperature poly-silicon thin film transistor located on the base substrate, wherein the low temperature poly-silicon thin film transistor comprises a poly-silicon active layer and a first gate which are laminated on the base substrate;

an oxide thin film transistor located on the base substrate, wherein the oxide thin film transistor comprises an oxide active layer and a second gate which are laminated on the base substrate; and a light shielding layer, wherein an overlapping area of a projection of the light shielding layer on the base substrate and an orthographic projection of the oxide active layer on the base substrate is S1, an overlapping area of the projection of the light shielding layer on the base substrate and an orthographic projection of the poly-silicon active layer on the base substrate is S2, and S1 is greater than S2;

wherein the oxide active layer is located on a side, facing away from the base substrate, of the first gate, and a first buffer layer is located between the oxide active layer and the first gate;

wherein a second buffer layer is located between the base substrate and the poly-silicon active layer; a barrier layer is further located between the second buffer layer and the base substrate; a first gate insulating layer is located between the poly-silicon active layer and the first gate; a second gate insulating layer is located between the oxide active layer and the second gate; and an interlayer dielectric layer is located on a side, facing away from the base substrate, of the second gate;

wherein the light shielding layer is located between a layer where the poly-silicon active layer is located and a layer where the base substrate is located, and the light shielding layer is located between the second buffer layer and the barrier layer.

12. The array substrate according to claim 11, wherein a source-drain layer is located on a side, facing away from the base substrate, of the interlayer dielectric layer, and the source-drain layer comprises a first source, a first drain, a second source, and a second drain;

the first source is connected to a source region of the poly-silicon active layer through a first via hole, and the first drain is connected to a drain region of the poly-silicon active layer through a second via hole; and the second source is connected to the oxide active layer through a third via hole, and the second drain is connected to the oxide active layer through a fourth via hole.

13. The array substrate according to claim 12, wherein a first flat layer is located on a side, facing away from the base substrate, of the source-drain layer;

a connection electrode is located on a side, facing away from the base substrate, of the first flat layer;

a second flat layer is located on a side, facing away from the base substrate, of the connection electrode;

an anode is located on a side, facing away from the base substrate, of the second flat layer; and the anode and the connection electrode are conducted through a fifth via hole penetrating the second flat layer, and the connection electrode and the first drain are conducted through a sixth via hole penetrating the first flat layer.

14. The array substrate according to claim 13, wherein a pixel defining layer is located on a side, facing away from the base substrate, of the anode, a spacer is located on a side, facing away from the base substrate, of the pixel defining layer, and the pixel defining layer has a hollow region where the anode is exposed.

* * * * *